United States Patent
Hynecek

(10) Patent No.: US 8,937,272 B2
(45) Date of Patent: Jan. 20, 2015

(54) VERTICAL JFET SOURCE FOLLOWER FOR SMALL PIXEL CMOS IMAGE SENSORS

(75) Inventor: Jaroslav Hynecek, Allen, TX (US)

(73) Assignee: Aptina Imaging Corporation, George Town (KY)

( * ) Notice: Subject to any disclaimer, the term of this patent is extended or adjusted under 35 U.S.C. 154(b) by 275 days.

(21) Appl. No.: 13/476,784

(22) Filed: May 21, 2012

(65) Prior Publication Data

US 2013/0146747 A1 Jun. 13, 2013

Related U.S. Application Data

(60) Provisional application No. 61/569,743, filed on Dec. 12, 2011.

(51) Int. Cl.
| | | |
|---|---|---|
| *H01L 31/062* | (2012.01) | |
| *H01L 31/113* | (2006.01) | |
| *H01L 27/146* | (2006.01) | |
| *G01J 1/44* | (2006.01) | |

(52) U.S. Cl.
USPC .................. 250/208.1; 250/214.1; 250/214 R; 257/292

(58) Field of Classification Search
CPC ................ H01L 31/0232; H01L 31/09; H01L 29/76816; H01L 29/42396; H01L 31/1136; H04N 3/155; H04N 5/335; G01J 1/44; H01J 40/14; H03F 3/06; H03F 3/14; H03F 3/165
USPC .................. 250/208.1, 214 A, 214.1, 214 R; 257/239, 242, 257, 258, 290–292, 440; 348/292–311

See application file for complete search history.

(56) References Cited

U.S. PATENT DOCUMENTS

| | | | |
|---|---|---|---|
| 5,563,429 | A | 10/1996 | Isogai |
| 5,625,210 | A | 4/1997 | Lee |

(Continued)

FOREIGN PATENT DOCUMENTS

| | | |
|---|---|---|
| JP | 2006049508 | 2/2006 |
| JP | 2006210680 | 8/2006 |

OTHER PUBLICATIONS

English translation of JP 2006-049508; Publication date: Feb. 16, 2006.*

(Continued)

*Primary Examiner* — Que T Le
*Assistant Examiner* — Carolynn A Moore
(74) *Attorney, Agent, or Firm* — Treyz Law Group; Jason Tsai

(57) ABSTRACT

An image sensor pixel suitable for use in a back-side-illuminated or a front-side-illuminated sensor arrangement is provided. The image sensor pixel may be a small size pixel that includes a source follower implemented using a vertical junction field effect (JFET) transistor. The vertical JFET source follower may be integrated directly into the floating diffusion node, thereby eliminating excess metal routing and pixel area typically allocated for the source follower in conventional pixel configurations. Pixel area may instead be allocated for increasing the charge storage capacity of the photodiode or can be used to reduce pixel size while maintaining pixel performance. Using a vertical junction field effect transistor in this way simplifies pixel addressing operations and minimizes random telegraph signal (RTS) noise associated with small size metal-oxide-semiconductor (MOS) transistors.

13 Claims, 4 Drawing Sheets

(56) References Cited

U.S. PATENT DOCUMENTS

| | | |
|---|---|---|
| 5,942,774 A | 8/1999 | Isogai et al. |
| 6,590,611 B1 | 7/2003 | Ishida et al. |
| 2008/0283886 A1 | 11/2008 | Hynecek |
| 2012/0175497 A1 | 7/2012 | Hynecek |

OTHER PUBLICATIONS

Hynecek. U.S. Appl. No. 13/450,154, filed Apr. 18, 2012.

* cited by examiner

US 8,937,272 B2

VERTICAL JFET SOURCE FOLLOWER FOR SMALL PIXEL CMOS IMAGE SENSORS

This application claims the benefit of provisional patent application No. 61/569,743, filed Dec. 12, 2011, which is hereby incorporated by reference herein in its entirety.

BACKGROUND

This relates to solid-state image sensors and, more specifically, to image sensors with small size pixels that are either front-side illuminated or back-side-illuminated. The small pixel size helps to reduce the cost of image sensor arrays. Sensor performance, however, should not be compromised as the size of pixels is reduced. Conventional image sensors detect light by converting impinging photons into electrons that are integrated (collected) in sensor pixels. Upon completion of each integration cycle, the collected charge is converted into voltage signals, which are then supplied to corresponding output terminals associated with the image sensor. Typically, the charge to voltage conversion is performed directly within the pixels, and the resulting analog pixel voltage signals are transferred to the output terminals through various pixel addressing and scanning schemes. The analog signal can sometimes be converted on-chip to a digital equivalent before being conveyed off-chip. Each pixel includes a buffer amplifier commonly referred to as a source follower (SF), which is used to drive output sensing lines that are connected to the pixels via respective address transistors.

After the charge-to-voltage conversion is complete and after the resulting signals are transferred out from the pixels, the pixels are reset before a subsequent integration cycle begins. In pixels having floating diffusions (FD) serving as the charge detection node, this reset operation is accomplished by momentarily turning on a reset transistor that connects the FD node to a fixed voltage reference for draining (or removing) any charge remaining at the FD node.

Removing charge from the floating diffusion node using the reset transistor, however, generates kTC-reset noise as is well known in the art. The kTC noise must be removed using correlated double sampling (CDS) signal processing technique in order to achieve desired low noise performance. Image sensors that utilize CDS typically require three transistors (3T) or four transistors (4T) per pixel. An example of the 4T pixel circuit with a pinned photo-diode can be found in Lee (U.S. Pat. No. 5,625,210), incorporated herein as a reference.

FIG. 1 is a simplified rendering of a cross-sectional side view of a conventional image sensor pixel 100. As shown in FIG. 1, conventional image sensor pixel 100 includes a photodiode 107 configured to collect photon-generated carriers, charge transfer transistor gate 108, N+ doped floating diffusion region 111, reset transistor gate 109, and source follower transistor gate 110. The reset transistor and the source follower transistor share an N+ drain region 112 that is biased to a fixed positive power supply voltage Vdd. The source follower transistor has an N+ source region 113 that is connected to a column sensing line Vout through metal via 115 (i.e., an output line to which each pixel in a given column is connected).

Note that floating diffusion region 111 is connected to source follower gate 110 via connection 116. This connection supplies the signal collected at the floating diffusion region to the source follower transistor gate. Pixel 100 may include an address transistor interposed between the region 113 and sensing line Vout that is common to all pixels in a given column of image sensor pixels. For simplicity, the address transistor is not shown in FIG. 1.

Pixel 100 is fabricated in an epitaxial substrate 101. A P+ doped layer 102 is deposited on the back surface of the sensor if the sensor is a back-side-illuminated image sensor. Substrate 101 may also be deposited on a substantially thicker P+ substrate (relative to layer 102) for the front-side-illuminated image sensors. Epitaxial layer 101 is covered by an oxide layer 103 that provides electrical isolation for gates 108, 109, and 110. Oxide material 103 typically extends into and fills up shallow trench isolation (STI) regions 114. An additional oxide layer 104 is deposited over the gates and serves as isolation for the metal wiring formed over pixel 100. Additional oxide isolation layers and the metal wiring layers are typically deposited over the top of pixel 100 (not shown).

Photodiode 107 includes a P+ layer 105 that is formed directly below layer 103 and that is connected to ground. This P+ doping layer reduces dark current by filling the silicon-silicon dioxide interface states with holes. Photon generated electrons are accumulated in N-type doped region 106. The accumulated charge is transferred to N+ floating diffusion region 111 when transfer gate 108 is turned on. Prior to turning on charge transfer gate 108, floating diffusion region 111 needs to be reset by pulsing signal that is supplied to gate 109 of the reset transistor.

An additional bottom P-implant (BTP) layer 117 is extended from P+ layer 105 formed under STI region 114 to the region under reset transistor gate 109 and source follower transistor gate 110 (see, FIG. 1). Layer 117 is connected to ground and serves to block photon generated electrons from entering regions 111, 112, and 113.

As is apparent from FIG. 1, a large portion of the valuable pixel area is occupied by transistor gates 108, 109, and 110. Forming transistors side-by-side on the surface of substrate 101 using this arrangement may be disadvantageous. It may therefore be desirable to provide image sensors with reduced pixel area, where a smaller portion of the pixel area is occupied by transistors and a larger portion of the pixel area is occupied by the photodiode.

DETAILED DESCRIPTION

Figure 1:
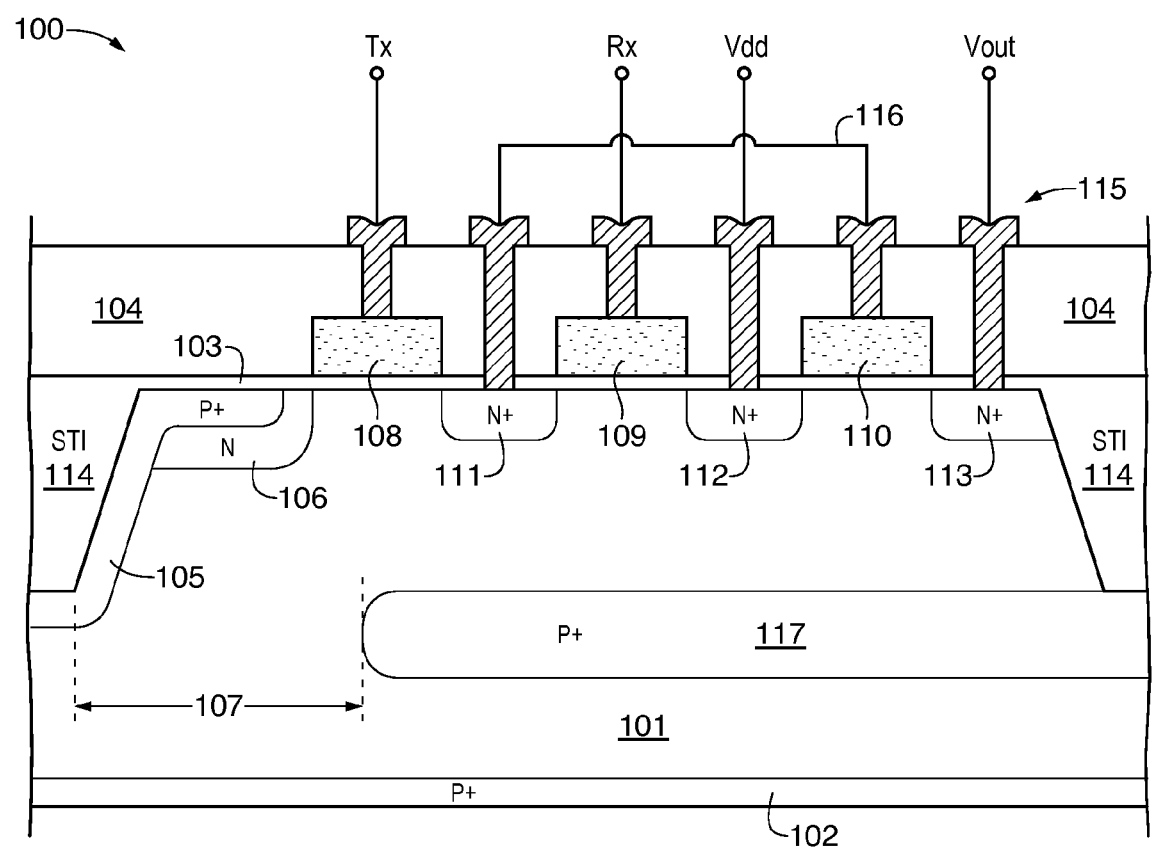
FIG. 1 is a simplified cross-sectional side view of a conventional image sensor pixel.
Figure 2:
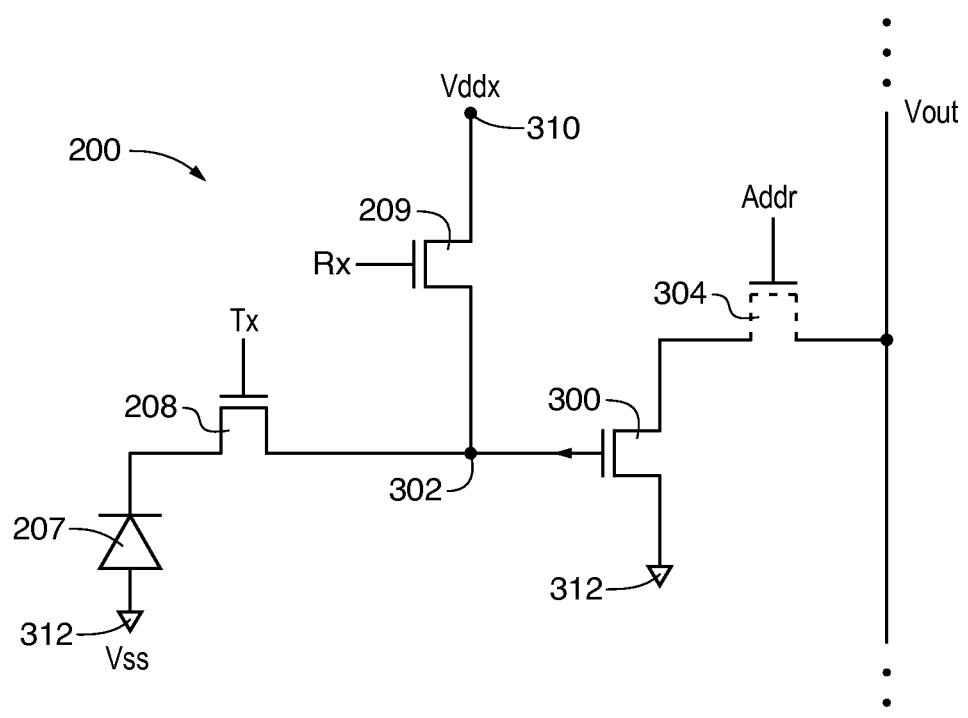
FIG. 2 is a simplified schematic diagram of an illustrative image sensor pixel with a vertical junction gate source follower in accordance with an embodiment of the present invention.

FIG. 2 is a simplified circuit diagram showing one suitable circuit arrangement for an image sensor pixel such as pixel 200. As shown in FIG. 2, pixel 200 may include a pinned photodiode 207, a charge transfer transistor 208, a reset transistor 209, and a source follower transistor 300. Charge generated from impinging photons may be collected using photodiode 207. Reset transistor 209 may be used to reset a floating diffusion node 302 associated with pixel 200 (e.g., by temporarily pulsing reset gate control signal Rx). Following the reset operation, the collected charge may be transferred to floating diffusion node 302 via the gate of charge transfer transistor 208 (e.g., by temporarily pulsing charge transfer gate control signal Tx). Source follower transistor 300 may be used to buffer the signal resulting from the transferred charge that appears on the floating diffusion node and to drive the corresponding column output line Vout.

Photodiode 207 may have a P-type doped region that is coupled to ground power supply terminal 312 (e.g., a power supply line on which ground power supply signal Vss is provided) and an N-type doped region that is coupled to floating diffusion node 302 via charge transfer transistor 208. Reset transistor 209 may have a drain region that is coupled to adjustable power supply terminal 310 (e.g., an adjustable power supply terminal on which adjustable power supply voltage Vddx is provided) and a source region that is coupled to floating diffusion node 302.

In accordance with an embodiment of the present invention, source follower transistor 300 may be a junction field effect transistor (JFET), whereas transistor 208 and 209 may be n-channel metal-oxide-semiconductor (NMOS) transistors. Source follower transistor 300 may have a source that is coupled to output sensing line Vout, a drain that is coupled to ground 312, and a gate that is coupled to floating diffusion region 302. As shown in FIG. 2, address transistor 304 (e.g., a transistor that is selectively turned on using address signal Addr) may optionally be interposed in the output path between the source of transistor 300 and output line Vout.

Figure 3:
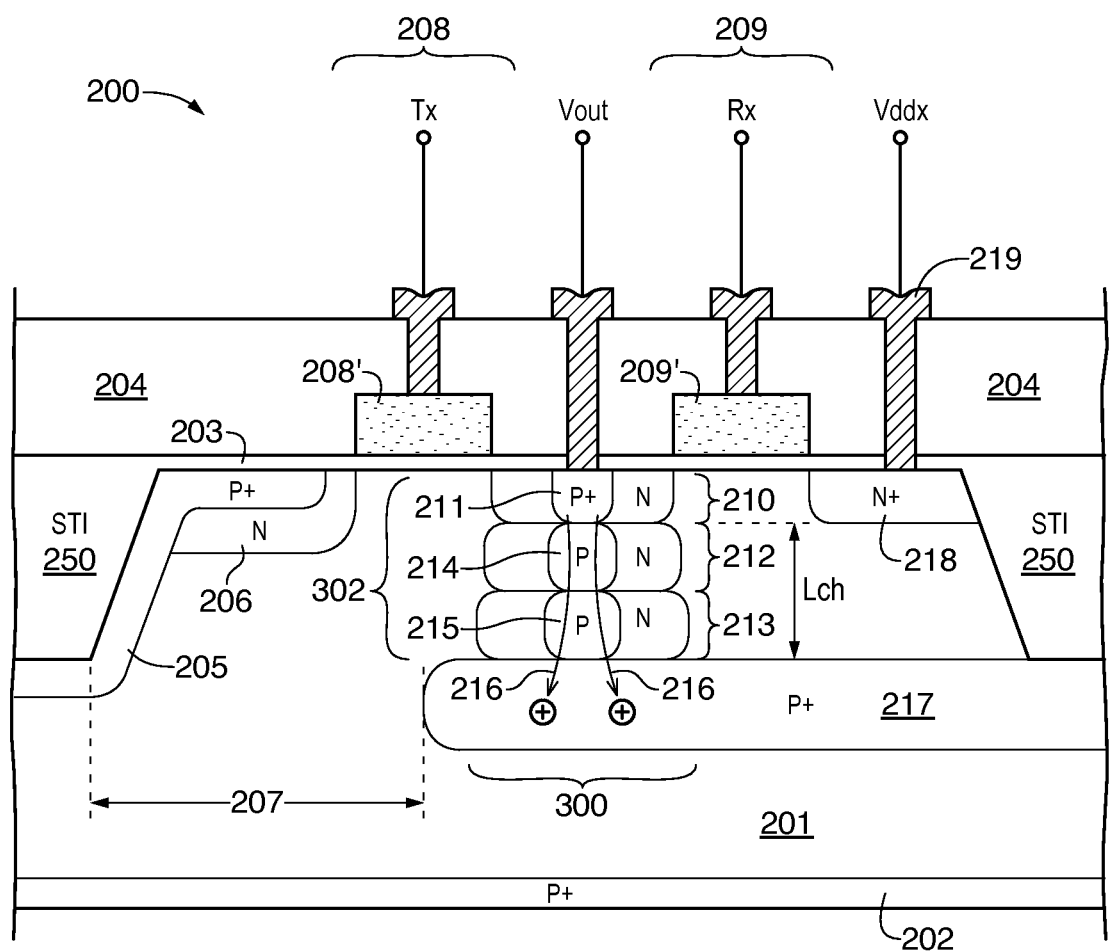
FIG. 3 is a simplified cross-sectional side view of an illustrative image sensor pixel of the type shown in FIG. 2 in accordance with an embodiment of the present invention.

FIG. 3 shows a simplified cross-sectional side view of image sensor pixel 200. As shown in FIG. 3, pixel 200 may be formed in an epitaxial substrate 201. A P+ doped layer 202 may be deposited on the back side of substrate 201 if pixel 200 is being used in a back-side-illuminated arrangement. If pixel 200 is being used in a front-side-illuminated configuration, epitaxial substrate 201 may be deposited on a thicker P+ silicon carrier (i.e., a silicon carrier with a thickness that is substantially larger than that of layer 202). Layer 202 may serve to reduce dark current by filling the silicon interface states with holes and thus quenching dark current generation. The silicon to silicon dioxide interface on the front side of substrate 201 in a pinned photodiode region 207 is also lined with a P+ doped layer 205 to help reduce dark current generation. Layer 205 may extend into substrate 201 under shallow trench isolation region 250.

Pinned photodiode 207 may be formed from P+ doped region 205 and N doped 206. Impinging photons may generate charge (e.g., electrons) that is temporarily stored in N-type region 206. Epitaxial substrate 201 may be covered by a dielectric layer such as silicon dioxide layer 203. Layer 203 may be formed between gate conductors of pixel 200 (e.g., the gate conductors 208' and 209') and substrate 201.

N+ region 218 may serve as the drain for reset transistor 209. N+ region 218 may be coupled to adjustable power supply voltage Vddx through conductive via 219. Voltage bias Vddx may be used as a reference voltage level to which pixel 200 may be reset. Reset transistor 209 has a gate 209' configured to receive signal Rx via corresponding control routing paths formed on top of inter-level oxide layer 204.

Similarly, charge transfer transistor 208 has a gate 208' configured to receive signal Tx via corresponding control routing paths formed on top of layer 204.

The detailed routing of control paths on which signals Tx, Vout, Rx, and Vddx are provided is not shown in FIG. 2 for simplicity. A dielectric stack that also includes alternating layers of conductive via layers and metal routing layers may be formed on top of pixel 200 over layer 204.

As shown in FIG. 3, pixel 200 may include N-type doped regions 210, 212, and 213 that collectively serve as floating diffusion region 302 for pixel 200. Floating diffusion region 302 formed in this way simultaneously serves as a source-drain for charge transfer transistor 208, as a source for reset transistor 209, and as a gate for source follower transistor 300 (e.g., transistor 300 may have a gate that is integrated into floating diffusion region 302).

A P+ doped region 211 that serves as the source for SF transistor 300 may be formed in region 210. P-type doped regions 214 and 215 that serve as the channel for transistor 300 may be formed in region 212 and 213, respectively. Transistor 300 having a p-type channel may sometimes be referred to as a p-channel JFET. A P+ doped region 217 may be formed below and adjacent to regions 214 and 215 to serve as the drain for transistor 300. Region 217 may be used as a photo-electron blocking layer for preventing pixel cross-talk and may sometimes be referred to as a bottom P-implant (BTP) layer. BTP layer 217 may be continuous with region 205 and may be coupled to ground 312 (see, e.g., FIG. 2).

When charge from region 206 in photodiode 207 is transferred onto floating diffusion 302 (i.e., region 210, 212, and 213), a voltage change may occur at the floating diffusion node 302. This voltage change may cause change of the source voltage of the JFET transistor 300 when constant current (or holes) flow from region 211 to region 216, as indicated by arrows 216.

In the example of FIG. 3, layers 212 and 213 may serve to define the channel length Lch for transistor 300 that extends vertically into substrate 201. Transistor 300 formed vertically within the surface of substrate 201 may therefore sometimes be referred to as a vertical JFET. If Lch is too short, SF transistor 300 may exhibit reduced gain due to drain-induce barrier lowering (DIBL) effects. It may therefore be desirable to form multiple regions such as regions 212 and 213 between P+ regions 211 and 217 so that Lch is greater than a predetermined minimum length. For example, at least three N-type regions, at least four N-type regions, or at least five N-type regions each of which includes P-type doped channel regions may be formed between the source and drain regions of vertical JFET source follower 300. Optimizing source follower channel length in this way does not introduce any undesired pixel area overhead.

The arrangement as described in connection with FIG. 3 in which pixel 200 uses P-type doped epitaxial substrate and n-type PD layer 206 to collect photo-generated electrons is merely illustrative and does not serve to limit the scope of the present invention. In some cases it may be advantageous to build pixels that accumulate holes instead of electrons. The same vertical JFET transistor concept described in connection with FIGS. 2 and 3 can thus be also used for such pixels. The doping type of the substrate, the doping types of the source-drain regions, and the type of the carrier collection should not be construed as a limiting case for this invention.

For example, the doping type of each region in pixel 200 may be swapped so that pixel 200 uses an N-type doped epitaxial substrate and a P-type PD layer 206 to collect photo-generated holes instead of electrons. Vertical source follower transistor 300 may be an n-channel JFET, wherein the P+ doped BTP layer 217 is replaced by an N+ bottom-implant (BTN) layer. Floating diffusion region 302 may include P-type doped implants 210, 212, and 213, whereas region 211 becomes an N+ doped region while regions 214 and 215 becomes N-type regions. Likewise, region 218 for associated with reset transistor 209 may also become a P+ doped region.

The biasing scheme for this type of pixel 200 would also be inverted. For example, charge transfer gate 208 and reset gate 209 may be turned on by respectively pulsing gate control signals Tx and Rx to a negative voltage level. Pixel 200 may instead by reset to an adjustable negative power supply level instead of Vddx.

Figure 4:
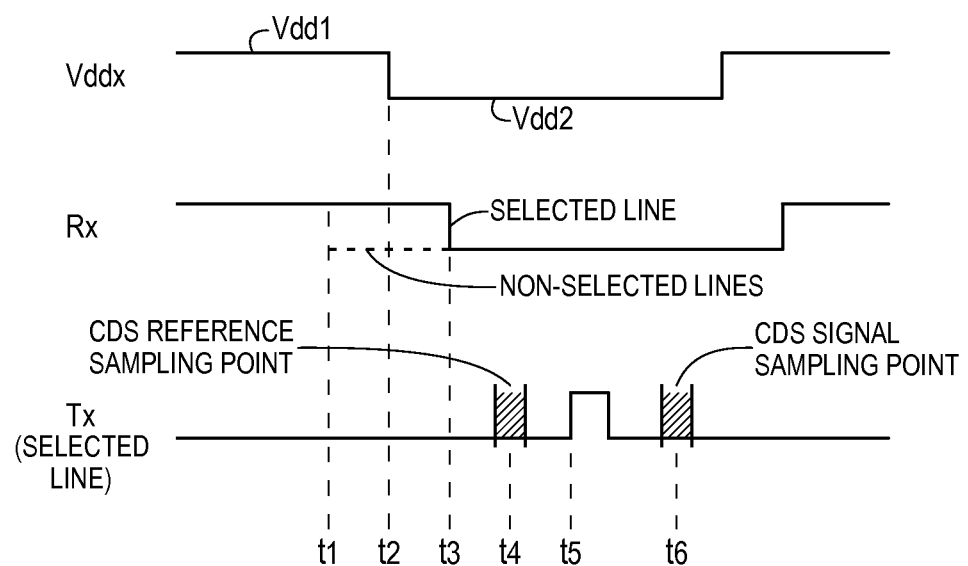
FIG. 4 is an example of a timing diagram illustrating how an image sensor pixel of the type shown in FIG. 2 may be operated in accordance with an embodiment of the present invention.

As discussed previously in connection with FIG. 2, an additional transistor for addressing pixel 200 need not be formed (e.g., an address transistor connecting the source terminal of transistor 300 to column sense line Vout need not be used). For example, the pixel reset bias level that is applied to region 218 may be modulated for pixel addressing purposes. FIG. 4 shows one suitable addressing scheme for pixel 200. During integration, Vddx and Rx are held high to drain any existing overflow charge from the overexposed photodiodes. This technique of draining overflow charge is sometimes referred to as blooming control. At the onset of a readout operation (at time t1), reset signal Rx on non-selected lines is driven low, thereby keeping the floating diffusion nodes associated with non-selected pixels at nominal positive power supply voltage Vdd1 during the entirety of the current readout operation. Doing so effectively ensures that the p-channel JFETs associated with the non-selected pixels are turned off.

At time t2, Vddx may be lowered from Vdd1 to a reduced positive power supply voltage level Vdd2. Bias level Vdd1 may be equal to 3.3 V, whereas Vdd2 may be equal to 2 V (as an example). Doing so will bring the reset level of the addressed floating diffusion regions lower, which turns on the p-channel JFETs in the selected pixels. At time t3, signal Rx associated with the selected line is driven low. When all the reset lines are deactivated, all the floating diffusion regions are now floating.

At time t4, the source follower output is sampled to obtain a reference sampling level that is stored in a CDS reference storage node. At time t5, transfer signal Tx associated with the selected pixels is pulsed high to transferred photo-generated charge into the floating diffusion region. At time t6, the source follower output is sampled to obtain a signal sampling level. The CDS may then subtract the signal sampling level from the stored reference sampling level to obtain a corresponding output signal level. Subsequently, Vddx and Rx may be driven high so that the overflow charge from the photodiodes can again be drained to Vdd1 in preparation for another integration or readout cycle.

Having thus described the preferred embodiments of the novel pixel for the back side illuminated or for the front side illuminated image sensor arrays that have small pixel size, high well capacity, low dark current, and the vertical JFET transistors serving as source followers (which are intended to be illustrative and not limiting), it is noted that the principles of this invention and various modifications can be made by those skilled in the art without departing from the scope and spirit of the invention.

Various embodiments have been described illustrating a small size pixel design exhibiting improved storage well capacity and low dark current. The pixel may include a photodiode (e.g., a pinned photodiode), a charge transfer transistor (sometimes referred to as a charge transfer gate), a reset transistor (sometimes referred to as a reset gate), and a source follower transistor. The small size pixel may include a vertical junction field effect transistor (JFET) that serves as the source follower.

The small size pixel may include a floating diffusion region that is shared among a source-drain of the charge transfer gate, a source-drain of the reset gate, and a gate of the vertical JFET source follower. The floating diffusion region may be formed using a plurality of vertically stacked N-type doping regions (as an example). A P+ doped region may be formed in one the of stacked regions to serve as a source for the vertical SF, whereas P-type doped regions may be formed in the remaining stacked regions to serve as a channel for the vertical JFET source follower. A bottom P+ implant layer may be formed below the stacked floating diffusion regions to serve as a drain for the vertical JFET source follower.

The use of the vertical JFET source follower may provide reduced random telegraph signal (RTS) noise typically associated with small metal-oxide-semiconductor source follower transistors. If desired, an additional address transistor need not be used. A selected pixel may be reset to a reduced bias level to differentiate from unselected pixels along a column of pixels that may have the SF gates held at higher bias levels.

The foregoing is merely illustrative of the principles of this invention which can be practiced in other embodiments.

What is claimed is:

1. An image sensor pixel, comprising:
   a semiconductor substrate;
   a photosensitive element formed in the semiconductor substrate;
   a floating diffusion region that includes at least two N-type doping regions formed at respective different depths within the semiconductor substrate;
   a charge transfer transistor coupled between the photosensitive element and the floating diffusion region; and
   a vertical junction field effect transistor (JFET) source follower coupled to the photosensitive element via the charge transfer transistor, wherein the vertical junction field effect transistor source follower has a gate that is integrated into the floating diffusion region, wherein the vertical junction field effect transistor source follower further includes a channel that is formed from at least two P-type doping regions implanted respectively within the at least two N-type doping regions associated with the floating diffusion region.

2. The image sensor pixel defined in claim 1, wherein the photosensitive element comprises a pinned photodiode configured to collect and store photo-generated electrons.

3. The image sensor pixel defined in claim 2, wherein the charge transfer transistor comprises an n-channel metal-oxide-semiconductor (NMOS) transistor.

4. The image sensor pixel defined in claim 3, further comprising:
   an n-channel metal-oxide semiconductor reset transistor.

5. The image sensor pixel defined in claim 1, wherein the vertical junction field effect transistor source follower further includes a drain that is formed from a P+ doping layer implanted beneath the at least two N-type doping regions associated with the floating diffusion region, and wherein the P+ doping layer is coupled to a ground power supply terminal.

6. The image sensor pixel defined in claim 1, wherein the charge transfer transistor comprises a p-channel metal-oxide-semiconductor (PMOS) transistor.

7. The image sensor pixel defined in claim 6, further comprising:
   a p-channel metal-oxide-semiconductor reset transistor.

8. An image sensor, comprising:
   an array of image sensor pixels, wherein each image sensor pixel in the array of image sensor pixels comprises:
      a semiconductor substrate;
      a photosensitive element formed in the semiconductor substrate;
      a floating diffusion region that includes at least two P-type doping regions formed at respective different depths within the semiconductor substrate;

a charge transfer transistor coupled between the photosensitive element and the floating diffusion region; and a vertical junction field effect transistor (JFET) source follower coupled to the photosensitive element via the charge transfer transistor, wherein the vertical junction field effect transistor source follower has a gate that is integrated into the floating diffusion region, wherein the vertical junction field effect transistor source follower further includes a channel that is formed from at least two N-type doping regions implanted respectively within the at least two P-type doping regions associated with the floating diffusion region.

9. The image sensor defined in claim 8, wherein each image sensor pixel in the array of image sensor pixel further comprises:

a reset transistor coupled between an adjustable power supply terminal and the floating diffusion region, wherein the reset transistor and the charge transfer transistor comprise n-channel metal-oxide-semiconductor (NMOS) transistors.

10. The image sensor pixel defined in claim 8, wherein the photosensitive element comprises a pinned photodiode configured to collect and store photo-generated electrons.

11. The image sensor pixel defined in claim 8, wherein the charge transfer transistor comprises an re-channel metal-oxide-semiconductor (NMOS) transistor.

12. The image sensor pixel defined in claim 8, wherein the reset transistor comprises an n-channel metal-oxide-semiconductor (NMOS) transistor.

13. The image sensor pixel defined in claim 8, wherein the vertical junction field effect transistor source follower further includes a drain that is formed from a N+ doping layer implanted beneath the at least two P-type doping regions associated with the floating diffusion region, and wherein the N+ doping layer is coupled to a power supply terminal.

* * * * *